United States Patent
Sett et al.

(10) Patent No.: US 6,847,114 B2
(45) Date of Patent: Jan. 25, 2005

(54) MICRO-SCALE INTERCONNECT DEVICE WITH INTERNAL HEAT SPREADER AND METHOD FOR FABRICATING SAME

(75) Inventors: Subham Sett, Colorado Springs, CO (US); Shawn Jay Cunningham, Colorado Springs, CO (US)

(73) Assignees: Turnstone Systems, Inc., Santa Clara, CA (US); Wispry, Inc., Irvine, CA (US)

( * ) Notice: Subject to any disclaimer, the term of this patent is extended or adjusted under 35 U.S.C. 154(b) by 0 days.

(21) Appl. No.: 10/291,146

(22) Filed: Nov. 8, 2002

(65) Prior Publication Data

US 2003/0116851 A1 Jun. 26, 2003

Related U.S. Application Data

(60) Provisional application No. 60/337,527, filed on Nov. 9, 2001, provisional application No. 60/337,528, filed on Nov. 9, 2001, provisional application No. 60/337,529, filed on Nov. 9, 2001, provisional application No. 60/338,055, filed on Nov. 9, 2001, provisional application No. 60/338,069, filed on Nov. 9, 2001, and provisional application No. 60/338,072, filed on Nov. 9, 2001.

(51) Int. Cl.[7] .................. H01L 23/34; H01L 21/44; H01L 21/48; H01L 21/50; H01R 43/00
(52) U.S. Cl. .................. 257/717; 257/720; 438/122; 29/884; 361/688
(58) Field of Search .................. 257/717, 720; 438/122; 29/884; 361/688, 711, 712; 156/257, 263, 273.3, 273.5, 306.6

(56) References Cited

U.S. PATENT DOCUMENTS

| 5,728,248 A | 3/1998 | Weber ................. 156/257 |
| 6,040,984 A * | 3/2000 | Hirakawa ................. 361/777 |

* cited by examiner

*Primary Examiner*—Craig A. Thompson
*Assistant Examiner*—Nema Berezny
(74) *Attorney, Agent, or Firm*—Pillsbury Winthrop LLP (57) ABSTRACT

A micro-scale interconnect device with internal heat spreader and method for fabricating same. The device includes first and second arrays of generally coplanar electrical communication lines. The first array is disposed generally along a first plane, and the second array is disposed generally along a second plane spaced from the first plane. The arrays are electrically isolated from each other. Embedded within the interconnect device is a heat spreader element. The heat spreader element comprises a dielectric material disposed in thermal contact with at least one of the arrays, and a layer of thermally conductive material embedded in the dielectric material. The device is fabricated by forming layers of electrically conductive, dielectric, and thermally conductive materials on a substrate. The layers are arranged to enable heat energy given off by current-carrying communication lines to be transferred away from the communication lines.

29 Claims, 5 Drawing Sheets

MICRO-SCALE INTERCONNECT DEVICE WITH INTERNAL HEAT SPREADER AND METHOD FOR FABRICATING SAME

RELATED APPLICATIONS

This nonprovisional application claims the benefit of U.S. Provisional Application No. 60/337,527, filed Nov. 9, 2001; U.S. Provisional Application No. 60/337,528, filed Nov. 9, 2001; U.S. Provisional Application No. 60/337,529, filed Nov. 9, 2001; U.S. Provisional Application No. 60/338,055, filed Nov. 9, 2001; U.S. Provisional Application No. 60/338,069, filed Nov. 9, 2001; U.S. Provisional Application No. 60/338,072, filed Nov. 9, 2001, the disclosures of which are incorporated by reference herein in their entirety. Additionally, the disclosures of the following U.S. Patent Applications, commonly assigned and simultaneously filed herewith, are all incorporated by reference herein in their entirety: U.S. Patent Applications entitled "MEMS Device having Contact and Standoff Bumps and Related Methods"; "MEMS Device having a Trilayered Beam and Related Methods"; "MEMS Switch having Electrothermal Actuation and Release and Method for Fabricating"; "Electrothermal Self-Latching MEMS Switch and Method"; and "Trilayered Beam MEMS Device and Related Methods."

TECHNICAL FIELD

The present invention generally relates to micro-scale electrical interconnect devices and the fabrication thereof. More particularly, the present invention relates to the integration of heat spreading elements with such interconnect devices.

BACKGROUND ART

Micro-scale devices or systems such as integrated circuits (ICs), opto-electronic and photonic devices, micromechanical devices, micro-electro-mechanical systems (MEMS), micro-opto-electro-mechanical systems (MOEMS or optical MEMS), chip-based biosensors and chemosensors, microfluidic devices (e.g., labs-on-a-chip), and other articles characterized by micron- and sub-micron-sized features often require the use of high-density electrical interconnect schemes for transmitting signals. The interconnect scheme can consist of a cross-bar array of communication lines located at different levels or planes of a micro-scale structure. For example, one level can contain an arrangement of parallel input lines, while another level can contain an arrangement of parallel output lines oriented orthogonal to the input lines. Any two levels of communication lines can be electrically isolated from each other by embedding the lines in dielectric material and/or building a dielectric layer between the levels.

It is desirable to integrate interconnect schemes with the architecture of such micro-scale devices and, in particular, array devices such as DC micro-relays. However, the electrical current carried through a high-density interconnect arrangement of communication lines can give rise to self-heating. Joule heating (h) is associated with the conduction of current (i) over time (t) through communication lines made from a material having a resistance (r), and can be expressed by Joule's law: $h = i^2 rt$. Joule heating gives rise to elevated temperatures in the various layers of a micro-scale structure and steep thermal gradients in dielectric layers. The heat energy dissipated through a micro-scale structure, particularly a MEMS device built over an interconnect scheme, can damage the components of the structure or impair the performance of those components. Depending on the current load, the elevated temperatures attained can result in thermally induced stress-related issues such as warping.

For example, a MEMS device can include a DC switch that utilizes a parallel-plate capacitor architecture for actuation purposes. A thermally-induced curvature in the substrate of this MEMS device could result in the shorting of the DC switch. As another example, in the case of very high current loads that are likely to occur during a power surge, the temperatures attained could be high enough to heat certain materials of a micro-scale device up to their melting point or transition temperature, and thus cause destruction of the entire device. Thus, while it is desirable to integrate a high-density interconnect scheme with a micro-scale device, the inclusion of the interconnect scheme would restrict the operating range of the device and raise concerns about the reliability of the device.

It would therefore be advantageous to provide an interconnect device that is structured to reduce maximum operating temperatures, thereby enabling the interconnect device and the useful features it provides to be integrated with a wide variety of micro-scale devices.

DISCLOSURE OF THE INVENTION

A method is provided for fabricating an interconnect device or interconnect array-containing device wherein a heat spreader is formed as an integral part of the overall fabrication process. An interconnect device comprising an integral heat spreader is also provided, and is suitable for integration with any micro-scale device that could benefit from such integration.

According to one embodiment, a micro-scale interconnect device is provided for transmitting electrical current or discrete signals. The device comprises first and second arrays of generally coplanar electrical communication lines and a heat spreader element. The first array can be disposed generally along a first plane. The second array can be disposed generally along a second plane spaced from the first plane, electrically isolated from the first array. The heat spreader element comprises a dielectric material disposed in thermal contact with at least one of the arrays, and a layer of thermally conductive material embedded in the dielectric material. The thermally conductive material is electrically isolated from the first and second arrays.

According to another embodiment, a micro-scale interconnect device comprises a first dielectric layer, a first layer of communication lines, a second dielectric layer, a thermally conductive layer, a third dielectric layer, and a second layer of communication lines. The first layer of communication lines can be formed on the first dielectric layer. The second dielectric layer can be formed on the first layer of communication lines and on the first dielectric layer. The thermally conductive layer can be formed on the second dielectric layer. The third dielectric layer can be formed on the thermally conductive layer. The second layer of communication lines can be formed on the third dielectric layer.

According to yet another embodiment, a micro-scale system comprises an interconnect device as described herein and a micro-scale device electrically communicating with one or more communication lines of the interconnect device. The micro-scale device can be any device that could benefit from the integration of an interconnect device with internal heat spreading capability as disclosed herein. Non-limiting examples of micro-scale devices include microelectronic devices and circuitry, MEMS devices, optical devices, microfluidic devices, and the like.

According to a method provided herein for fabricating a micro-scale device having internal heat spreading capability to reduce operating temperature, a plurality of generally coplanar arrays of electrical transmission lines can be formed in a heterostructure. A thermally conductive element can be embedded in one or more dielectric layers. The thermally conductive element can be disposed at a location of the heterostructure where a heat transfer path can be established in response to a thermal gradient that is generally directed from at least one of the arrays to the thermally conductive layer. The thermally conductive element can be interposed between two arrays and serve as a capacitive shield.

According to another method, a first array of conductive elements can be formed on a substrate. A first dielectric layer can be deposited on the first array. A layer of thermally conductive material can be deposited on the first dielectric layer. A second dielectric layer can be deposited on the layer of thermally conductive layer. A second array of conductive elements can be formed on the second dielectric layer.

According to yet another method, current is conducted in a micro-scale interconnect device at a reduced device operating temperature. The interconnect device comprises a first array of generally coplanar electrical communication lines disposed generally along a first plane, and a second array of generally coplanar electrical communication lines disposed generally along a second plane that is spaced from the first plane and electrically isolated from the first array. The current is conducted through at least one of the communication lines of the first or second arrays. Heat energy given off by the current-conducting communication line is transferred away from the arrays by providing a heat spreader element integrated with the interconnect device. The heat spreader element comprises a dielectric material disposed in thermal contact with at least one of the arrays, and a layer of thermally conductive material embedded in the dielectric material. The heat energy is directed toward the heat spreader element in response to a thermal gradient that is created between the current-conducting communication line and the heat spreader element.

Micro-scale devices fabricated according to the above-stated methods are also provided.

It is therefore an object of the invention to provide a micro-scale interconnect device with an internal heat spreader and related methods of fabrication and use.

An object of the invention having been stated hereinabove, and which is achieved in whole or in part by the invention disclosed herein, other objects will become evident as the description proceeds when taken in connection with the accompanying drawings as best described hereinbelow.

DETAILED DESCRIPTION OF THE INVENTION

For purposes of the present disclosure, it will be understood that when a given component such as a layer, film, region or substrate is referred to herein as being disposed or formed "on" another component, that given component can be directly formed on the other component or, alternatively, intervening components (for example, one or more buffer, transition or lattice-matching layers, interlayers, adhesion or bonding layers, electrodes or contacts) can also be present. It will be further understood that the terms "disposed on" and "formed on" are used interchangeably to describe how a given component is positioned or situated in relation to another component. Moreover, terms such as "disposed on" and "formed on" are not intended to introduce any limitations relating to particular methods of material deposition, film growth, or other fabrication techniques.

For the purpose of the present disclosure, the term "layer" denotes a generally thin, two-dimensional structure having an out-of-plane thickness in the micrometer range. The term "layer" is considered to be interchangeable with other terms such as film, thin film, coating, cladding, plating, and the like.

The naming herein of any specific material compositions (e.g., $SiO_2$, Cu, Au, and the like), is not intended to imply that such materials are completely free of impurities, trace components, or defects. Moreover, the material compositions identified herein are not limited to any specific crystalline or noncrystalline microstructure.

Figure 1A:
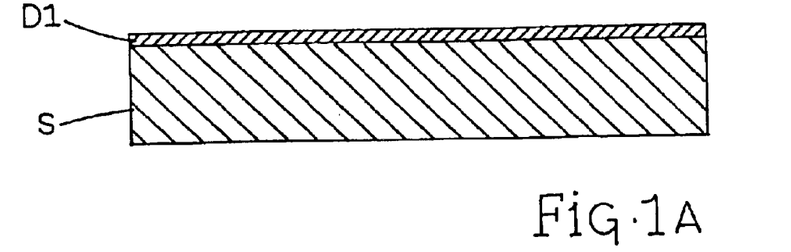
FIGS. 1A–1G are sequential cross-sectional views of an interconnect device as it is being fabricated.
Figure 1B:
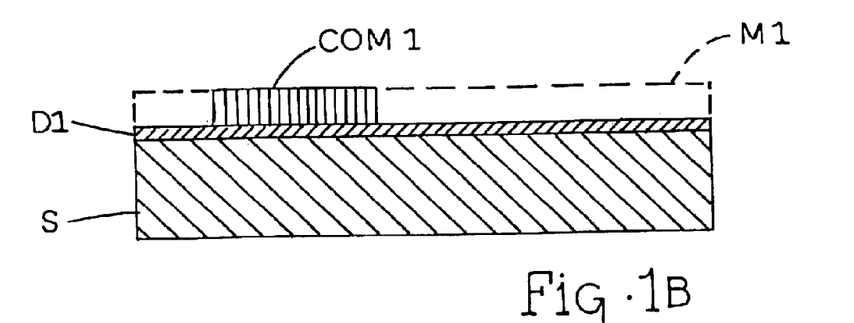
Figure 1C:
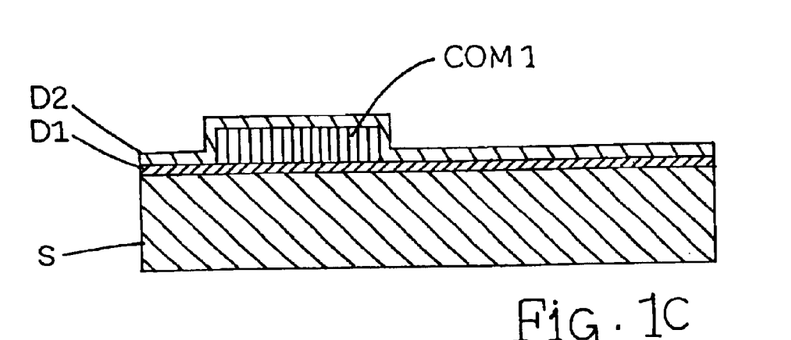
Figure 1D:
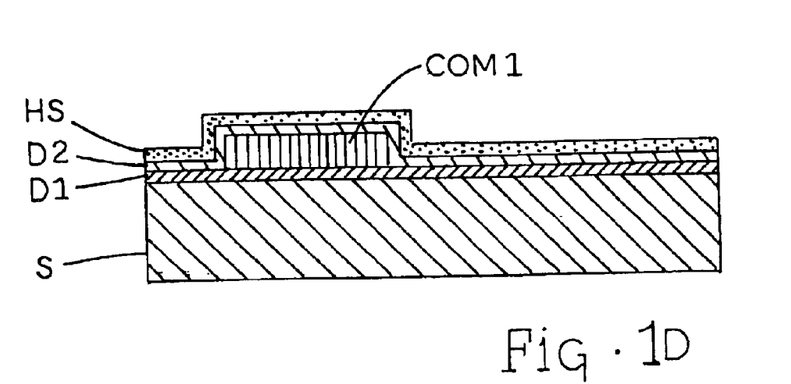
Figure 1E:
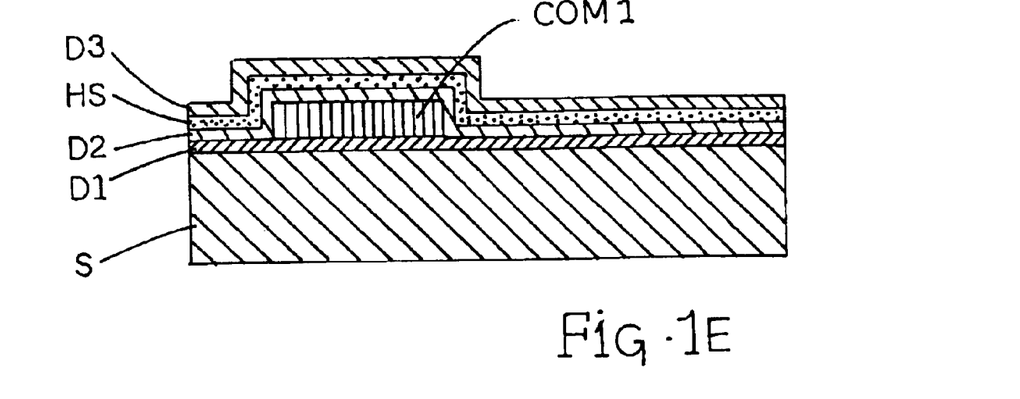
Figure 1F:
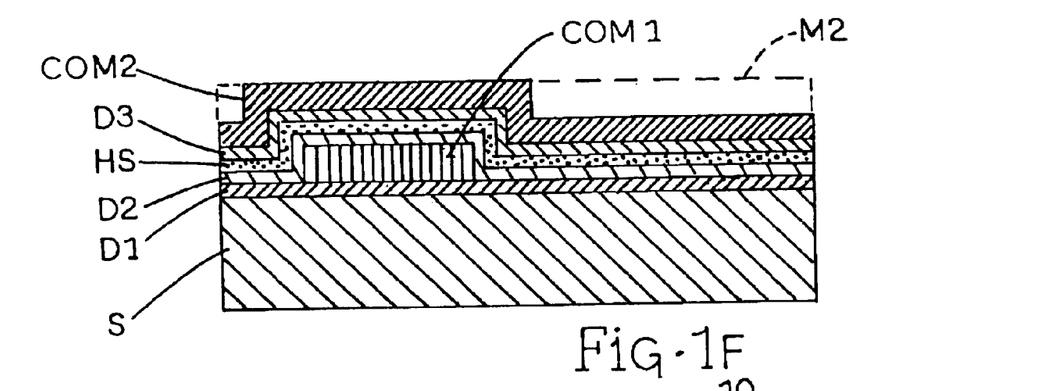
Figure 1G:
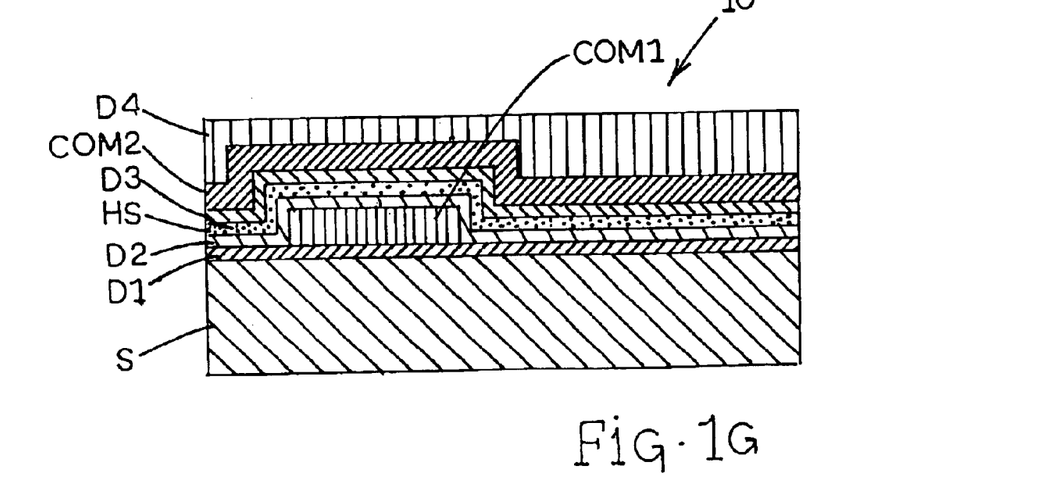

Referring now to FIGS. 1A–1G, one method for fabricating an electrical interconnect device, generally designated 10 in FIG. 1G, will now be described. Referring first to FIG. 1A, a suitable substrate S is selected as a base material on which conductive and non-conductive layers are to be formed. Substrate S can be composed of any material commonly employed as a substrate in micro-scale fabrication such as, for example, silicon or a silicon-containing compound. Silicon or a silicon-containing compound is preferred because such material is readily, commercially available at low cost, and is compatible for use as a starting substrate S on which a wide variety of commonly employed conductive and non-conductive materials can be formed by widely accepted fabrication techniques (e.g., deposition, electroplating, and the like). In addition, depending on the specific final product contemplated, interconnect device 10 (see FIG. 1G) can be integrated with other micro-scale devices or circuitry that require a substrate having semi-conducting properties, in which case a silicon substrate common to both interconnect device 10 and one or more other micro-scale components might be desirable.

It will be noted that the following fabrication process can include any intermediate process steps considered necessary or desirable by persons skilled in the art to be carried out between the adding of specific layers to substrate S. Such intermediate process steps can include surface micromachining techniques such as chemomechanical polishing (CMP) to planarize, clean, or otherwise prepare certain layers for subsequent material-additive steps; drilling or etching techniques for creating vias, cavities or apertures through certain layers where needed; the addition and subsequent removal of transient layers such as photoresist materials and their residue; cleaning steps such as chemical stripping, plasma etching and the like; and other surface preparation procedures. The details of these intermediate processes, the appropriateness of their use during any stage of the interconnect fabrication process, and the equipment required, are generally known to persons skilled in the art and hence are not described further herein.

With continuing reference to FIG. 1A, a first dielectric isolation layer D1 is formed on substrate S. Preferably, first dielectric isolation layer D1 includes a suitable dielectric material exhibiting a low dielectric constant (low-k) such as, for example, silicon dioxide ($SiO_2$). As will be appreciated by persons skilled in the art, the technique utilized for forming first dielectric isolation layer D1 typically will depend at least in part on the material comprising first dielectric isolation layer D1. In the case of $SiO_2$, a deposition process is commonly employed. A wide variety of viable deposition processes for forming dielectric layers or films are known to persons skilled in the art, and thus need not be described in detail herein. Alternative processes such as thermal oxidation might also be appropriate.

In an alternative embodiment, instead of including a semiconductor material, substrate S can be a bulk structural layer that is dielectric. Non-limiting examples of dielectric materials suitable for use as a bulk structural layer include silica, various glasses, sapphire, nitrides of silicon, and the like. In the case where substrate S is composed of a dielectric material, the addition of first dielectric isolation layer D1 is not required.

Referring to FIG. 1B, a first electrically conductive layer M1 is formed on first dielectric isolation layer D1. First electrically conductive layer M1 can be composed of any electrically conductive material. Preferably, first electrically conductive layer M1 is composed of a metal exhibiting suitable electrical conductivity such as, for example, copper (Cu). As will be appreciated by persons skilled in the art, the technique utilized for forming first electrically conductive layer M1 will typically depend at least in part on the material comprising first electrically conductive layer M1 and its compatibility with the material selected for first dielectric isolation layer D1. In the case of copper, an electroplating process is commonly employed. It is further appreciated by persons skilled in the art, however, that a wide variety of deposition processes might alternatively be utilized for forming metallic layers on dielectric layers. The particular techniques for laying down metals in a micro-scale environment are generally known and thus need not be described in detail herein.

As shown in FIG. 1B, after film formation, first electrically conductive layer M1 is then patterned by any suitable technique, such as masking followed by etching as understood by persons skilled in the art, to form a set of first transmission or communication lines COM1. While the cross-section of only one communication line COM1 is illustrated in FIG. 1B, it will be appreciated by persons skilled in the art that first electrically conductive layer M1 can preferably be patterned to form a plurality of spaced-apart communication lines COM1 on first dielectric isolation layer D1 to provide multiple routes for electrical signals, as exemplified in the cross-bar configuration illustrated in FIG. 2.

Referring to FIG. 1C, a second dielectric isolation layer D2 is formed on the pattern of first communication lines COM1 and on the exposed regions of first dielectric isolation layer D1. Like first dielectric isolation layer D1, second dielectric isolation layer D2 is preferably composed of a suitable low-k dielectric material such as $SiO_2$. Referring to FIG. 1D, a thermally conductive layer HS is then formed on second dielectric isolation layer D2 to serve as a heat spreader. Preferably, the out-of-plane thickness of thermally conductive layer HS can range from approximately 0.1 to approximately 1 microns. Thermally conductive layer HS can include any material that is thermally conductive such as, for example, gold (Au), copper, aluminum (Al), and diamond. In the case of gold, a physical deposition technique such as sputtering can be employed to form thermally conductive layer HS, although alternative techniques such as electroplating could be employed. Referring to FIG. 1E, a third dielectric isolation layer D3 is formed on thermally conductive layer HS. Like first and second dielectric isolation layers, third dielectric isolation layer D3 is preferably composed of a suitable low-k dielectric material such as $SiO_2$.

Figure 2:
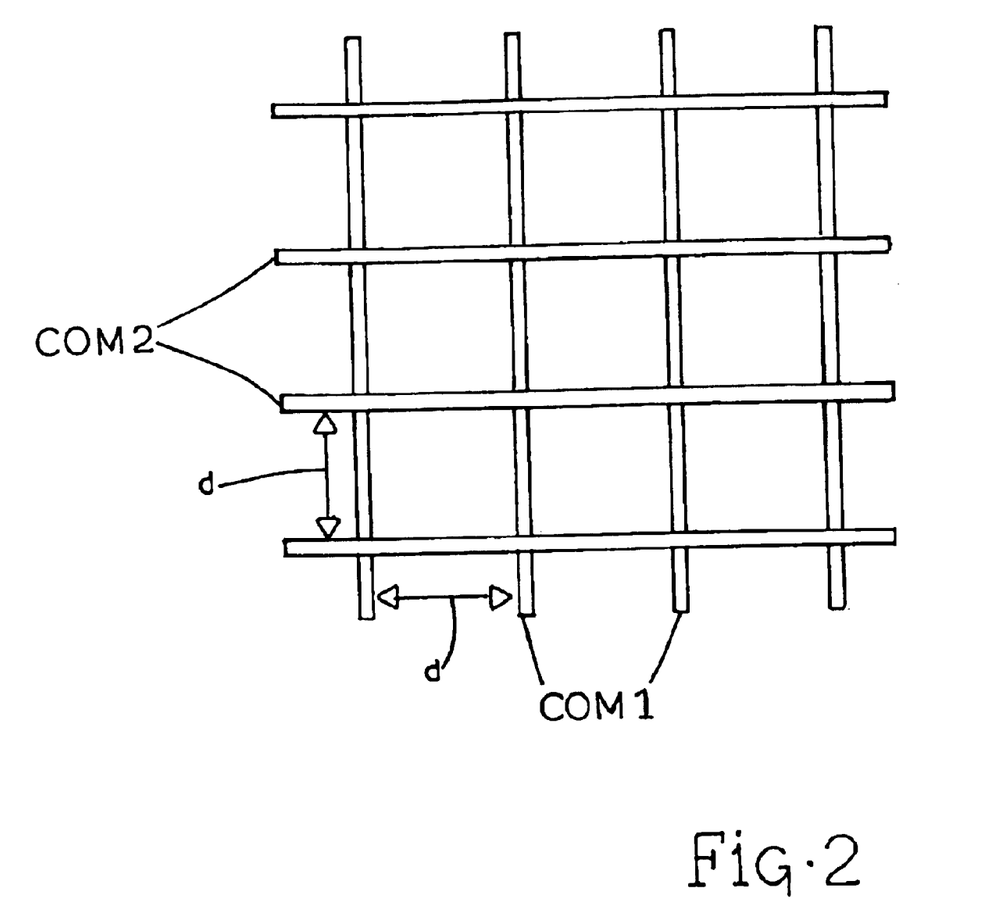
FIG. 2 is a top plan view of an array of communication lines that can form a part of the interconnect device.

Referring to FIG. 1F, a second electrically conductive layer M2 is formed on third dielectric isolation layer D3. Like first electrically conductive layer M1, second electrically conductive layer M2 is preferably composed of a metal such as copper. Second electrically conductive layer M2 is then patterned by any suitable technique to form a second set of communication lines COM2, which in typical embodiments are arranged generally orthogonally relative to the first set of communication lines COM1 formed from first electrically conductive layer M1. While a section of only one communication line COM2 of second electrically conductive layer M2 is illustrated in FIG. 1F, it will be appreciated by persons skilled in the art that second electrically conductive layer M2 is preferably patterned to form a plurality of spaced-apart communication lines COM2 on third dielectric isolation layer D3, as shown in FIG. 2.

Referring to FIG. 1G, the fabrication of interconnect device 10 is completed by forming a fourth dielectric isolation layer D4 on the pattern of second communication lines COM2. Like first, second and third dielectric isolation layers D1–D3, fourth dielectric isolation layer D4 is preferably composed of a suitable low-k dielectric material such as $SiO_2$.

For the exemplary embodiment presently being described, FIGS. 1A–1G show the conformal deposition of dielectric isolation layers D2–D4, thermally conductive layer HS, and second electrically conductive layer M2 around the shape of the first communication lines COM1 formed from first electrically conductive layer M1. As an alternative, some or all of these layers could be planarized. For instance, second dielectric isolation layer D2 could be deposited and planarized to a specific thickness above first communication lines COM1. Second dielectric isolation layer D2 could be planarized by a process such as chemical-mechanical polishing (CMP). Thermally conductive layer HS would then be deposited on second dielectric isolation layer D2, which defines a specific distance to first electrically conductive layer M1. Third dielectric isolation layer D3 would then be deposited on thermally conductive layer HS. Third dielectric layer D3 and thermally conductive layer HS are largely planar because they are deposited on a planar surface. Second electrically conductive layer M2 would be deposited on third dielectric isolation layer D3, which is a planar surface. Fourth dielectric isolation layer D4 is deposited on third dielectric isolation layer D3 and second electrically conductive layer M2 and planarized to a specific thickness above second electrically conductive layer M2. Fourth dielectric isolation layer D4 could be planarized by methods such as chemical-mechanical polishing (CMP). The benefits of the heat spreader HS layer are realized for a planar process or a conformal process, if the widths of communication lines COM1 and second communication lines COM2 lines are large relative to their thickness. In either case, most of the heat flow would be between the first electrically conductive layer M1 and second electrically conductive layer M2 rather than laterally between first communication lines COM1 or second communication lines COM2. The goal of the heat spreader is to accomplish driving the heat flow laterally and reducing the localized temperature, especially by driving heat energy away from likely hot spots such as regions where communication lines COM1 and COM2 cross each other. If the width and thickness of the first electrically conductive layer M1 and second electrically conductive layer M2 lines are of comparable magnitude, the conformal process might provide greater heat spreading (local temperature reduction) than the planarized case.

It will be noted that FIG. 1G is a cross-sectional depiction of a portion of the resulting interconnect device 10. In practice, a high-density array or grid of several rows and columns of communication lines COM1 and COM2 is formed from first and second electrically conductive layers M1 and M2, as exemplified in the cross-bar configuration illustrated in FIG. 2. First communication lines COM1 are disposed generally along a first plane and second communication lines COM2 are disposed generally along a second plane that is spaced from the first plane. In one embodiment, the spacing between first communication lines COM1 and second communication lines COM2 can range from approximately 3 to approximately 8 microns. The spacing between each adjacent, co-planar pair of first communication lines COM1, and between each adjacent, co-planar pair of second communication lines COM2, is indicated by a distance d in FIG. 2. Distance d can range from approximately 25 to approximately 250 microns, and preferably is approximately 125 microns. In one embodiment, distance d between all adjacent, coplanar pairs of communication lines COM1 and COM2 is uniform. By evenly spacing communication lines COM1 and COM2 in this manner, the distribution of heat energy through interconnect device 10 is rendered more uniform which, for large interconnect densities, can assist in reducing the maximum operating temperature in addition to the integration of thermally conductive layer HS. In one embodiment, the width of each communication line COM1 and COM2 across the layer on which it is formed can range from approximately 10 to approximately 100 microns, and preferably is approximately 100 microns. The thickness of each communication line COM1 and COM2 on its corresponding layer can range from approximately 1 to approximately 5 microns, and preferably is approximately 3 microns The thickness of first dielectric isolation layer D1 is typically 0.5 to 1 micron. The thickness of second dielectric isolation layer D2 is typically 1 to 5 microns, and preferably is approximately 1.5 microns. The thickness of third dielectric isolation layer D3 is typically 1 to 5 microns, and preferably is approximately 1.5 microns. The thickness of fourth dielectric isolation layer D4 is typically 1 to 5 microns, and preferably is approximately 3 microns.

In a cross-bar configuration such as illustrated in FIG. 2, one design goal enabled by the invention is to minimize the resistance of the communication lines COM1 and COM2 and minimize the heating that results from a self-heating process. Additionally, the dimensions of the dielectric and conductive layers are optimized with regard to resistance, heating, temperature, and capacitive coupling. Additionally, the volume fraction of the electrically conductive layers to the dielectric layers is optimized to minimize the stress and curvature that are developed in substrate S with regard to residual stress fields within the layers, with regard to differences in thermal coefficients of expansion, or with regard to temperature gradients through the layers and substrate S.

It can be seen from FIG. 1G that thermally conductive layer HS constituting the heat spreader is sandwiched between first and second communication lines COM1 and COM2 formed from first and second electrically conductive layers M1 and M2, respectively, as a buried, integral component of interconnect device 10. Second and third dielectric isolation layers D2 and D3 electrically isolate thermally conductive layer HS from first and second electrically conductive layers M1 and M2, respectively. First dielectric isolation layer D1 electrically isolates the as-built conductive/non-conductive heterostructure of interconnect device 10 from its substrate S. Fourth dielectric isolation layer D4 electrically isolates second communication lines COM2 of second electrically conductive layer M2 from any circuitry or devices fabricated on interconnect device 10.

As described hereinabove, thermally conductive layer HS is preferably composed of a metal such as gold, and thus preferably is also electrically conductive. Accordingly, it will be noted that any two of the three metal layers illustrated in FIG. 1G could serve as first and second electrically conductive layers M1 and M2 for forming first and second communication lines COM1 and COM2, with the remaining third metal layer serving as thermally conductive layer HS and thus as the heat spreader. However, in the embodiment illustrated in FIG. 1G in which thermally conductive layer HS is sandwiched between first and second communication lines COM1 and COM2, thermally conductive layer HS could additionally function as a capacitive shield. Hence, by providing proper grounding to thermally conductive layer HS, out-of-plane capacitive coupling between first and second communication lines COM1 and COM2 could be reduced in at least some embodiments. Additionally, a thermally conductive layer HS added between substrate S and the communication lines COM1 and COM2 will block the electromagnetic coupling to substrate S. The electrostatic shielding is applicable for capacitive coupling and RF pads for application at "low frequencies". In this example of capacitive coupling, thermally conductive layer HS can be largely unpatterned with the exception of regions where connections will be established between first and second communication lines COM1 and COM2. Additionally, thermally conductive layer HS can be patterned to reduce the total amount of metalization used while maintaining the thermal advantage. Additionally, thermally conductive layer HS will need to be patterned for it to provide shielding when inductors are part of substrate S. The shield needs to be patterned to limit the effect of eddy currents, which produce opposing magnetic fields resulting in reduced energy storage and reduced Q (quality factor). The design of the shield for inductor applications is known to those skilled in the art and is not described further herein.

Figure 3:
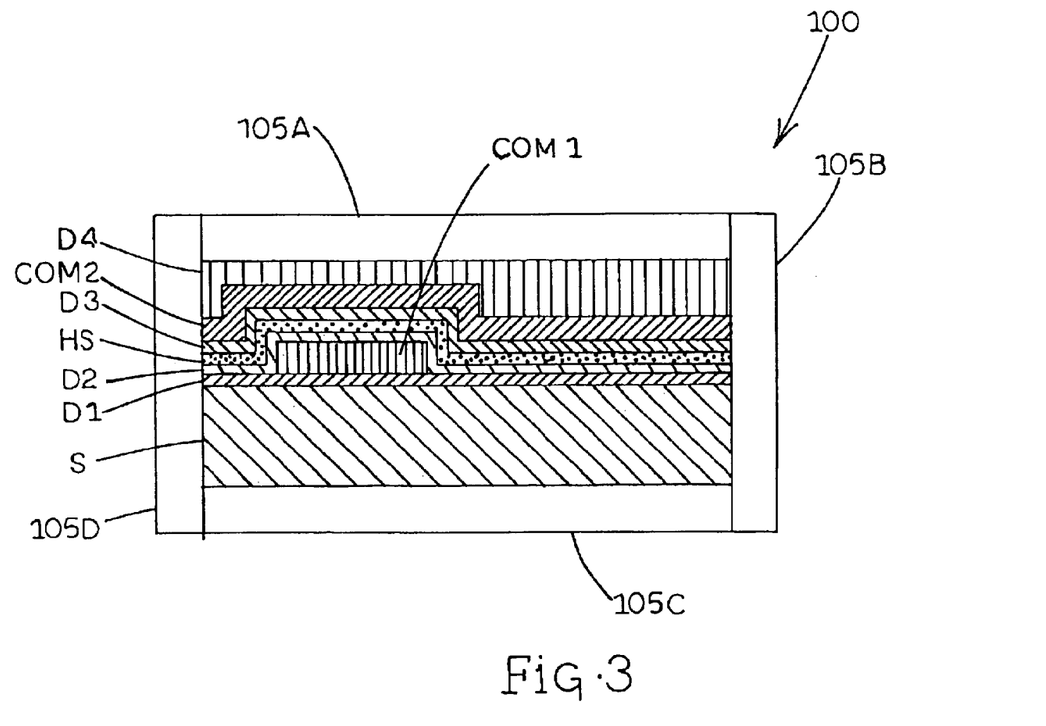
FIG. 3 is a cross-sectional view of an interconnect device integrated with a micro-scale device that includes other micro-scale devices, systems, and/or features.

Referring now to FIG. 3, a micro-scale system, generally designated 100, includes the heterostructure of interconnect device 10 as integrated with any other micro-scale device, circuitry, or instrument fabricated typically on the heterostructure at device region 105A, and/or at device regions 105B, 105C, and 105D. As non-limiting examples, device regions 105A, 105B, 105C, and/or 105D could represent microelectronic devices or integrated circuits having active and/or passive circuit elements such as transistors, resistors, capacitors, MOS or related circuit components, contacts, electrodes, and electrical leads; opto-electronic and photonic devices such as windows, lenses, light-emitting diodes (LEDs), laser diodes (LDs), photodiode arrays, mirrors, filters, flat-panel displays, and waveguides; micromechanical devices such as deflectable cantilevers and membranes, and encapsulating, structural, or packaging components; MEMS devices such as microrelays, micromotors, gyroscopes, accelerometers, and thermally-induced components and transducers in general; MOEMS devices such as movable optical shutters, attenuators, electromagnetic radiation detectors, and switches; chip-based biosensors and chemosensors; and microfluidic devices such as labs-on-a-chip (LoC), micro-total analysis systems ($\mu$-TAS), or other devices having microfluidic-related features such as micropumps, microchannels, reservoirs, sample stamping arrays, and inkjet-type nozzles.

Figure 4:
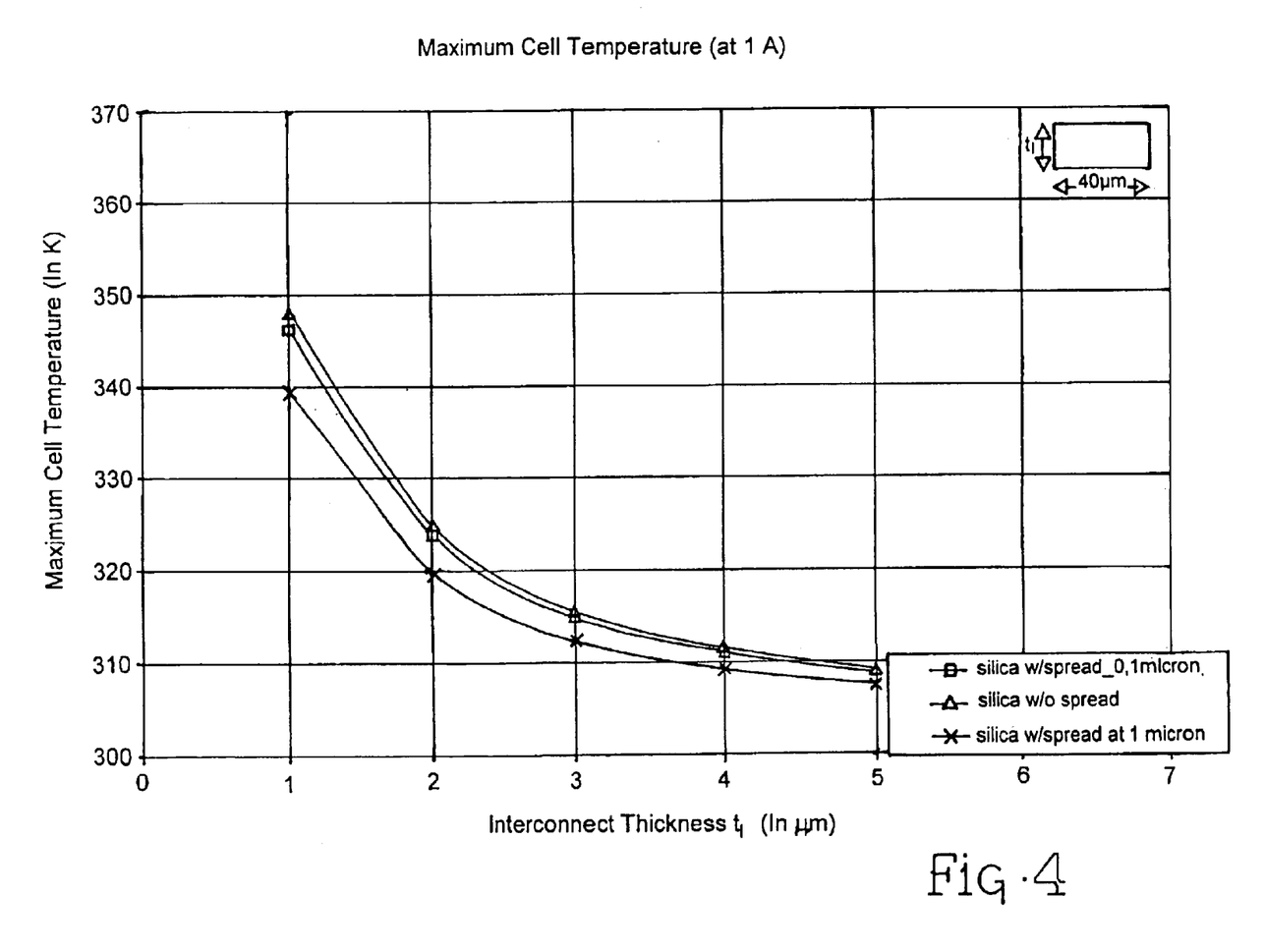
FIG. 4 is a plot of data obtained from a comparative steady-state electrothermal analysis of the interconnect device with and without the inclusion of a heat spreading component.

Referring now to FIG. 4, the results of a comparative, steady-state electro-thermal analysis performed on a unit cell are illustrated. The unit cell is representative of a DC switch array having an interconnect scheme as illustrated in FIG. 1G. The dielectric material considered for the isolation layers was silica, the metal considered for the electrically conductive layers was copper, and the metal considered for the thermally conductive heat spreading layer was gold. As indicated in FIG. 4, the width of the unit cell is 40 microns and the thickness ($t_i$) is varied along the horizontal axis of the data plot. As further indicated in FIG. 4, maximum operating temperature is plotted as a function of unit cell thickness for three separate cases: a heat spreader thickness of zero (i.e., no heat spreader), 0.1 micron, and 1 micron. It can be observed from FIG. 4 that the presence of a 1-micron thick heat spreader significantly reduces maximum temperature reached in the unit cell at progressively greater unit cell thicknesses. Moreover, FIG. 4 shows that the gains observed due to the incorporation of the heat spreader are more significant moving down to thinner transmission lines. Also, the reduction obtained would be significant at even higher current magnitudes due the current-squared dependence of the Joule Heating effect.

It will be understood that various details of the invention may be changed without departing from the scope of the invention. Furthermore, the foregoing description is for the purpose of illustration only, and not for the purpose of limitation—the invention being defined by the claims.

What is claimed is:

1. A micro-scale interconnect device for transmitting electrical current or discrete signals, comprising:
   (a) a first array of generally coplanar electrical communication lines disposed generally along a first plane;
   (b) a second array of generally coplanar electrical communication lines disposed generally along a second plane spaced from the first plane and electrically isolated from the first array; and
   (c) a heat spreader element comprising a dielectric material disposed in thermal contact with at least one of the arrays, and a layer of thermally conductive material embedded in the dielectric material, wherein the thermally conductive material is electrically isolated from the first and second rays and wherein the dielectric material comprises first and second dielectric layers, the first and second dielectric layers comprise exactly the same material.

2. The device according to claim 1 wherein the first array is separated from the second array by a distance ranging from approximately 3 to approximately 8 microns.

3. The device according to claim 1 wherein adjacent coplanar communication lines of each array are separated from each other by a distance ranging from approximately 25 to approximately 250 microns.

4. The device according to claim 1 wherein each communication line has a width ranging from approximately 10 to approximately 100 microns.

5. The device according to claim 1 wherein each communication line has a thickness ranging from approximately 1 to approximately 5 microns.

6. The device according to claim 1 wherein the first array, the second array, and the heat spreader element are formed on an electrically isolated substrate.

7. The device according to claim 6 wherein the substrate is a semiconductor material and the first dielectric layer is formed on the substrate.

8. The device according to claim 6 wherein the substrate is a bulk dielectric substrate.

9. The device according to claim 1 wherein the heat spreader element is interposed between the first and second arrays of communication lines.

10. The device according to claim 9 wherein the thermally conductive layer is interposed between the first and second dielectric layers.

11. The device according to claim 10 wherein the first dielectric layer is formed on the first array, the thermally conductive layer is formed on the first dielectric layer, the second dielectric layer is formed on the thermally conductive layer, and the second array is formed on the second dielectric layer.

12. The device according to claim 11 comprising a top dielectric layer formed on the second array.

13. The device according to claim 11 wherein the first array is formed on an electrically isolated substrate.

14. The device according to claim 13 wherein the substrate is a bulk dielectric substrate.

15. The device according to claim 13 wherein the substrate is a semiconductor material and the first dielectric layer is formed on the substrate.

16. The device according to claim 1 wherein the thermally conductive material has an out-of-plane thickness ranging from approximately 0.1 to approximately 1 microns.

17. The device according to claim 1 wherein the thermally conductive material comprises a material selected from the group consisting of gold, copper, aluminum, and diamond.

18. A micro-scale interconnect device for transmitting electrical current or discrete signals, comprising:
   (a) a first dielectric layer;
   (b) a first layer of communication lines formed on the first dielectric layer;
   (c) a second dielectric layer formed on the first layer of communication lines and on the first dielectric layer;
   (d) a thermally conductive layer formed on the second dielectric layer;
   (e) a third dielectric layer formed on the thermally conductive layer, wherein the first, second, and third dielectric layers comprise exactly the same material; and
   (f) a second layer of communication lines formed on the third dielectric layer.

19. The device according to claim 18 wherein the first dielectric layer is formed on a substrate.

20. The device according to claim 18 wherein the first dielectric layer is a bulk substrate.

21. The device according to claim 18 wherein the first dielectric layer has a thickness ranging from approximately 0.5 to approximately 1 micron.

22. The device according to claim 18 wherein adjacent coplanar communication lines of each array are separated from each other by a distance ranging from approximately 25 to approximately 250 microns.

23. The device according to claim 18 wherein the thermally conductive material has an out-of-plane thickness ranging from approximately 0.1 to approximately 1 microns.

24. The device according to claim 18 wherein the thermally conductive material comprises a material selected from the group consisting of gold, copper, aluminum, and diamond.

25. The device according to claim 18 wherein at least one of the dielectric layers has a thickness ranging from approximately 1 to approximately 5 microns.

26. A micro-scale system comprising:
(a) a first array of generally coplanar electrical communication lines disposed generally along a first plane;
(b) a second array of generally coplanar electrical communication lines disposed generally along a second plane spaced from the first plane and electrically isolated from the first array;
(c) a heat spreader element comprising a dielectric material disposed in thermal contact with at least one of the arrays, and a layer of thermally conductive material embedded in the dielectric material, wherein the thermally conductive material is electrically isolated from the first and second arrays and wherein the dielectric material comprises first and second dielectric layers, the first and second dielectric layers comprises exactly the same material; and
(d) a micro-scale device electrically communicating with a communication line of at least one of the first and second arrays.

27. The system according to claim 26 wherein adjacent coplanar communication lines of each array are separated from each other by a distance ranging from approximately 25 to approximately 250 microns.

28. The system according to claim 26 wherein the thermally conductive material has an out-of-plane thickness ranging from approximately 0.1 to approximately 1 microns.

29. The system according to claim 26 wherein the thermally conductive material comprises a material selected from the group consisting of gold, copper, aluminum and diamond.

* * * * *